United States Patent [19]

Sutherland

[11] Patent Number: 5,187,800
[45] Date of Patent: Feb. 16, 1993

[54] ASYNCHRONOUS PIPELINED DATA PROCESSING SYSTEM

[75] Inventor: Ivan E. Sutherland, Pittsburgh, Pa.

[73] Assignee: Sun Microsystems, Inc., Mountain View, Calif.

[21] Appl. No.: 107,839

[22] Filed: Oct. 13, 1987

Related U.S. Application Data

[63] Continuation of Ser. No. 689,625, Jan. 8, 1985, abandoned, which is a continuation-in-part of Ser. No. 688,848, Jan. 4, 1985, abandoned.

[51] Int. Cl.⁵ .............................................. G06F 13/00
[52] U.S Cl. ........................... 395/800; 395/DIG. 1; 395/DIG. 2; 395/200; 364/228; 364/229; 364/229.4; 364/231.8; 364/231.9
[58] Field of Search ... 364/200 MS File, 900 MS File, 364/768, 784, 785, 786, 787, 788; 395/DIG. 1, DIG. 2, 800, 500, 200, 250

[56] References Cited

U.S. PATENT DOCUMENTS

| | | | |
|---|---|---|---|
| 4,241,419 | 12/1980 | Kronies | 364/900 |
| 4,423,482 | 12/1983 | Hargrove et al. | 364/200 |
| 4,428,048 | 1/1984 | Berlin, Jr. | 364/200 |
| 4,509,187 | 4/1985 | Ackland et al. | 381/43 |
| 4,692,894 | 9/1987 | Bemis | 364/900 |
| 4,712,175 | 12/1987 | Torii et al. | 364/200 |

Primary Examiner—Thomas C. Lee
Assistant Examiner—Robert B. Harrell
Attorney, Agent, or Firm—Nilsson, Wurst & Green

[57] ABSTRACT

An asynchronous form of pipeline processor has a storage capability for partially processed data. When the processor is empty, it functions as a combinatorial circuit producing resultant data processed as desired. As necessary, the processor registers data, however, it continues to advance other data as rapidly as possible. A control unit individually provides binary control signals to a plurality of processing apparatus to maintain order with respect to processing and storing data. Switching structures controlled by the control unit along with amplifiers are provided at the input and output of individual processors to set the processing apparatus to process or store data. Processing several sets of data simultaneously while preserving proper order enables the system to do logic and arithmetic processing at a relatively high speed.

15 Claims, 6 Drawing Sheets

ASYNCHRONOUS PIPELINED DATA PROCESSING SYSTEM

This is a continuation of application Ser. No. 689,625 filed Jan. 8, 1985, now abandoned, which is a continuation-in-part of co-pending application Ser. No. 688,848, filed Jan. 4, 1985, and directed to an invention by Ivan E. Sutherland entitled ASYNCHRONOUS FIFO SYSTEM now abandoned in favor of application Ser. No. 118,997 filed Nov. 10, 1987, and entitled ASYNCHRONOUS FIRST-IN-FIRST-OUT REGISTER STRUCTURE, now U.S. Pat. No. 4,837,740.

BACKGROUND AND SUMMARY OF THE INVENTION

Recent years have seen phenomenal growth and development in the field of digital data processing, both with respect to component structures and system implementations. Important aspects of that development have involved increased operating speeds and simplicity of design. In general, the present invention is directed to an improved data processing system that is pertinent to both the criteria of speed and simplicity of design. The system is asynchronous, operating without clock signals. Accordingly, systems of the present invention can function at speeds determined by the circuitry within the system.

An embodiment of the present invention fashioned as an asynchronous pipeline processor is disclosed herein. As disclosed, the asynchronous pipeline processor is proposed to incorporate elements of high-speed memory.

In a specific form, the system of the present invention may be implemented as a high-speed multiplier. Generally, two main types of high-speed multipliers are in common use. The first type is called the combinatorial or array multiplier. In such multipliers, a combinational circuit free of data storage elements is used to form the product of two input numbers, i.e., a multiplier and a multiplicand. Consider an operating system.

The numerical values may be represented in a binary format, each being represented by N bits. A suitable array for developing the product of the two values may contain N binary adders that feed values to each other in sequence. Each adder either adds zero or a suitably shifted version of the multiplicand to a partial product developed by previous adders in the system. Whether a particular adder adds zero or the multiplicand value depends on the current bit from the multiplier.

As traditionally implemented, combinatorial multipliers lack sufficient operating speed for certain applications. That is, while a combinatorial multiplier produces answers faster than a single adder (since a single adder must perform N separate additions in sequence) the combinatorial multiplier is still too slow in certain applications. Roughly speaking, the time it takes to pass information through the array of a combinatorial multiplier is equal to the time it takes for signals to progress through the carry chain of a single adder plus the time it takes for signals to progress through the least significant bits of all N adders, without regard for carry propogation.

An N by N array multiplier can be designed in which the operating time approximates 2 N gate delays. By using Booth's well-known algorithm to reduce the number of adders required from N to N/2, an array multiplier can be designed with a time delay of about 1.5 N gate delays. Other techniques for increasing speed can be implemented to reduce the time delay somewhat further (however, such designs tend to become very complex).

Improved performance in digital multipliers is offered by an alternate prior-art form, the synchronous pipeline multiplier. Such multipliers are characterized by storage elements in the array of adders to hold partially developed answers. The storage elements receive a common clock so that signal-represented data values march through the multiplier to the timing of a clock. As the number of storage elements are increased in such multipliers, the clock rate speed can increase because the data signals need pass through less circuitry between storage elements. Unfortunately, the number of clock pulses required to move data (from input to output) through the increased number of storage elements also increases. Thus, a basic dilemma occurs in the design of synchronous pipeline multipliers. As more storage elements are introduced, the amount of logic (and thus the time between elements) decreases; accordingly the clock rate can be increased. But unfortunately, as more storage elements are introduced, the number of clock pulses required to move data through the entire system (input to output) also increases. Consequently, the time to process an isolated value may also increase.

Moreover, in a prior-art synchronous pipeline multiplier, the speed at which the clock can run depends on the slowest operating speed of any stage in the pipeline. Consequently, as a design consideration, the fact that the slowest unit must establish the speed of the clock necessitates accurately computing the speed of each stage. In systems utilizing integrated circuits, in which operating speed can vary from batch from batch, and where speed may depend on specific physical layouts of circuit parts, accurately computing operating speeds can be very difficult.

In general, the system of the present invention simplifies the design of pipeline data processing systems. Specifically, an asynchronous pipeline processor in accordance herewith is easier to design because each stage can proceed at its own pace independent of any external clock signal. The design will produce correct answers independently of the speed of individual stages, providing the control part of each stage functions faster than the data part. That is, in the system as set forth below in detail, the control elements for each stage function faster than the data processing cells for each stage.

Although the overall speed of an asynchronous pipeline processor in accordance herewith is still set by the slowest element, the burst speed for both input and output functions can be higher than that of the slowest element if faster stages of the pipeline proceed and follow the slowest stage. Accordingly, consideration might well be given to selective arragement of individual processing apparatus.

In general, the system of the present invention provides a useful alternative to traditional processors, specifically combinatorial array processors and synchronous pipeline processors. The system of the present invention generally retains the advantages of each system and substantially avoids the disadvantages. In operation, an asynchronous pipeline processor in accordance herewith behaves like a combinatorial array processor when it is empty and therefore is easy to test and responds quickly to new data. When the asynchronous pipeline processor is partly full, it can process several data values simultaneously, similarly to the operation of a synchronous pipeline processor.

While the system of the present invention has been discussed in terms of a multiplier, it is important to appreciate that it can be utilized to introduce pipelining into virtually any logical array. That is, as will be apparent to those skilled in the art from the following description, the principles of the present asynchronous pipeline processor is valid for implementation of any process to be performed by a series of logical steps.

In general, the system of the present invention involves processing cells which are linked in a chain to perform logical processing steps. The processing cells are interconnected to provide retrograde data paths and are controlled by an associated series of control elements. Specifically, the control elements actuate switching structures in the processing cells to move data for processing and accomplish storage in the pipeline.

BRIEF DESCRIPTION OF THE DRAWINGS

In the drawings, which constitute a part of the specification, exemplary embodiments exhibiting various objectives and features hereof are set forth, specifically.

DETAILED DESCRIPTION OF THE INVENTION

As required, detailed illustrative embodiments of the invention are disclosed herein. The embodiments merely exemplify the invention which may, of course, be constructed in various other forms, some of which may be quite different from the disclosed illustrative embodiments. However, specific structural and functional details disclosed herein are merely representative and in that regard provide a basis for the claims herein which define the scope of the present invention.

Figure 1:
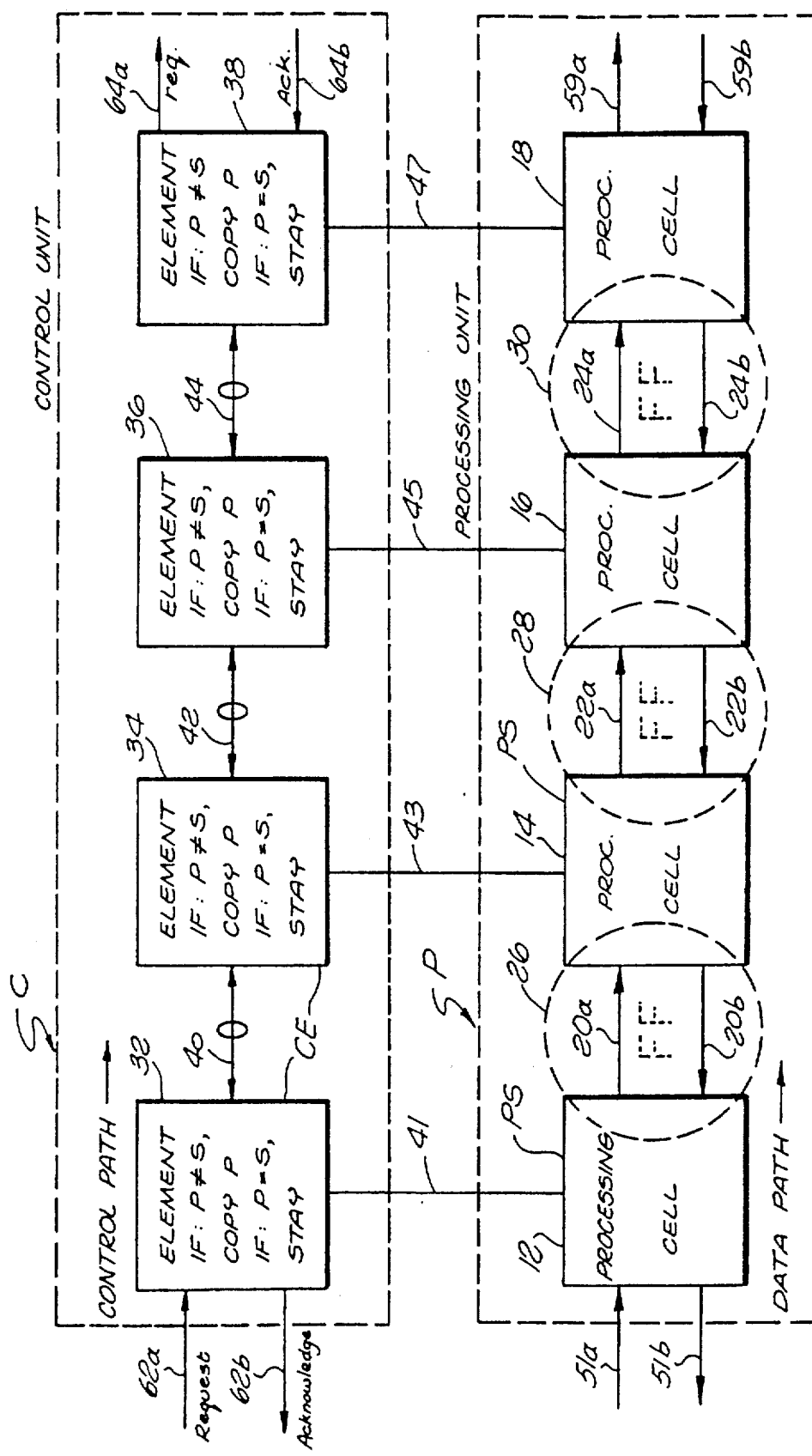
FIG. 1 is a block diagram of an embodiment of the present invention.

FIG. 1 illustrates an asynchronous pipeline processor constructed in accordance with the present invention. A control unit C (top) is operatively coupled to a data unit D (bottom), each showing a few representative stages. The data unit D is composed of a series of processing cells PS (four) and the control unit C is composed of a series of control elements CE (four).

Essentially, signal-represented data moves stage by stage through the processing unit P under control of signals from the control unit C. Each control element CE in the control unit C has two binary states, and a relatively simple philosophy of operation implements state changes in each of the elements. Specifically, in implementing total control, each control element CE follows a specific operating rule: if the preceding element is in a binary state different from the succeeding element, assume the state of the preceding element, otherwise remain as set. The control states generated by that philosophy of operation function to control the processing cells PS in the processing unit P to selectively perform processing operations or define flip-flops (binary associations) to register data as a result of retrograde data paths.

Note that each processing cell PS is dynamic, including amplifier capability but containing no storage. However, the individual processing cells PS may be associatively paired by retrograde data paths to create flip-flops when required for data storage.

As illustrated, the processing unit P contains four processing cells PS, specifically designated as cells 12, 14, 16 and 18. Longer strings of cells are of course possible and likely for many implementations as explained below. Each cell is interconnected for two-way data communication with both its predecessor and successor cells. For example, cells 12 and 14 are interconnected for bidirectional data signal flow as illustrated by the arrowed lines 20a and 20b, each line comprising several signals. Similarly, lines 22a and 22b (each of which may comprise several signals) along with similar lines 24a and 24b respectively interconnect the cells 14 to 16 and 16 to 18.

It is to be understood that means may be used other than a pair of wires as represented by each of the lines to interconnect the processing cells. A system using complex voltage and current signalling on a single wire or frequency multiplexed signals in an optical fiber represent a few of the several alternatives. Also, other than electrical or light signal structures could be employed.

As indicated above and explained in detail below, the bidirectional communication between individual processing cells PS in the data processing unit P enables the cells PS to combine and provide binary storage. Flip-flops can be provided between adjacent pairs of cells PS. As illustrated in FIG. 1 by dashed-line circles 26, 28 and 30 (designated with symbols FF) each pair of adjacent processing cells PS may cooperate to function as a flip-flop and store a bit of data. In a flip-flop configuration, pairs of cells cooperate so that each receives and reflects the data it shares with its neighbor.

Note that while possible flip-flops 26, 28 and 30 are represented, each is only a possibility. In that regard, a data unit may define flip-flops with either its predecessor or its successor, or both at the same time. In operation, such flip-flops may either hold or pass data depending on the contents of the processor. The absence of established flip-flops indicates the processing unit P is clear and a digit placed in the processor will be processed to completion through the last processing cell ready to exit.

The movement of data signals through the individual processing cells 12, 14, 16 and 18 (independent of any clock timing) is specified by the control unit C. That is, data is received by the processing unit P through input lines 51a and 51b to pass through the processing cells PS from left to right under control of the control unit C. In that regard, the control unit C has a "request" signalling input line 62a and an "acknowledge" signalling line 62b. At the output end of the control unit an output "request" signalling line 64a cooperates with an output signal "acknowledge" line 64b.

Various detailed structures illustrating exemplary processing cells are disclosed in detail below. However at this stage it is important to recognize that the data cells are somewhat similar, each embodying switching apparatus, retrograde amplification apparatus and usually a processing apparatus as for performing arithmetic or logical processing functions.

The switching apparatus within each processing cell PS is controlled by the cell's associated control element CE. As a basis for understanding the movement of data in the processing unit P, the operation of the control unit C will now be explained.

As indicated above, each of the individual control elements CE operate on the basis of a simple rule:

If the predecessor and successor elements of an individual control element differ in state, then it is to copy the state of the predecessor control element; otherwise it is to remain in its present state.

This rule can be written in a short form as:

If $P \neq S$ copy P; if $P = S$, stay.

Recapitulating to some extent, both the control elements CE and the processing cells PS are essentially binary. Specifically, the elements CE are 2-state devices which provide signals to establish the processing cells PS in either of two switched configurations. In one switched configuration the processing cells PS individually act on data flowing through the pipeline. In the alternate switched configuration, the processing cells PS may associate in pairs to provide data storage flip-flops. Such flip-flops occur when adjacent control elements CE enduringly retain opposed binary states. The details of such control are set out at length in the co-pending parent case. However, for an understanding of the operation of the control unit C reference will first be made to FIG. 2 showing an illustrative structure for the control elements CE.

Figure 2:
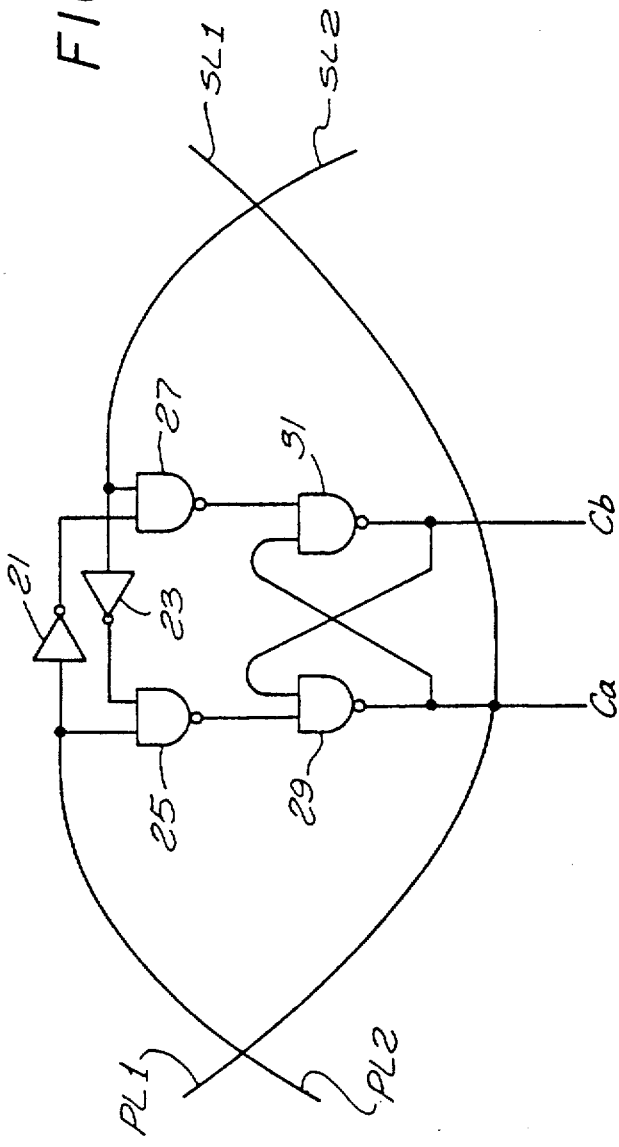
FIG. 2 is a symbolic block diagram of a fragment of the system of FIG. 1 showing detailed exemplary implementation.

FIG. 2 is a schematic diagram of a control element known as a Muller C element well known in the art and suitable for use in the control unit, as the elements CE. More complex control elements might be designed. For example, a control element with three states might be connected to three data elements so as to make them operate cyclically. A variety of other arrangements may prove useful and economical.

The Muller C element of FIG. 2 is formed of inverters 21 and 23 (top), well known logic elements operating in combination with NAND gates 25, 27, 29, and 31 also well known logic elements. The gates 29 and 31 are cross coupled with second inputs from the gates 25 and 27 to provide outputs Ca and Cb in accordance with the rule of essential operation as stated above, e.g. $P \neq S$, copy P; $P = S$, stay as set.

The states of the preceding (P) and subsequent (S) elements CE are manifest respectively on the lines PL2 and SL2. The state of this control element, manifest as output Ca is delivered to the preceding and subsequent control elements respectively on the lines PL1 and SL1.

Figure 3:
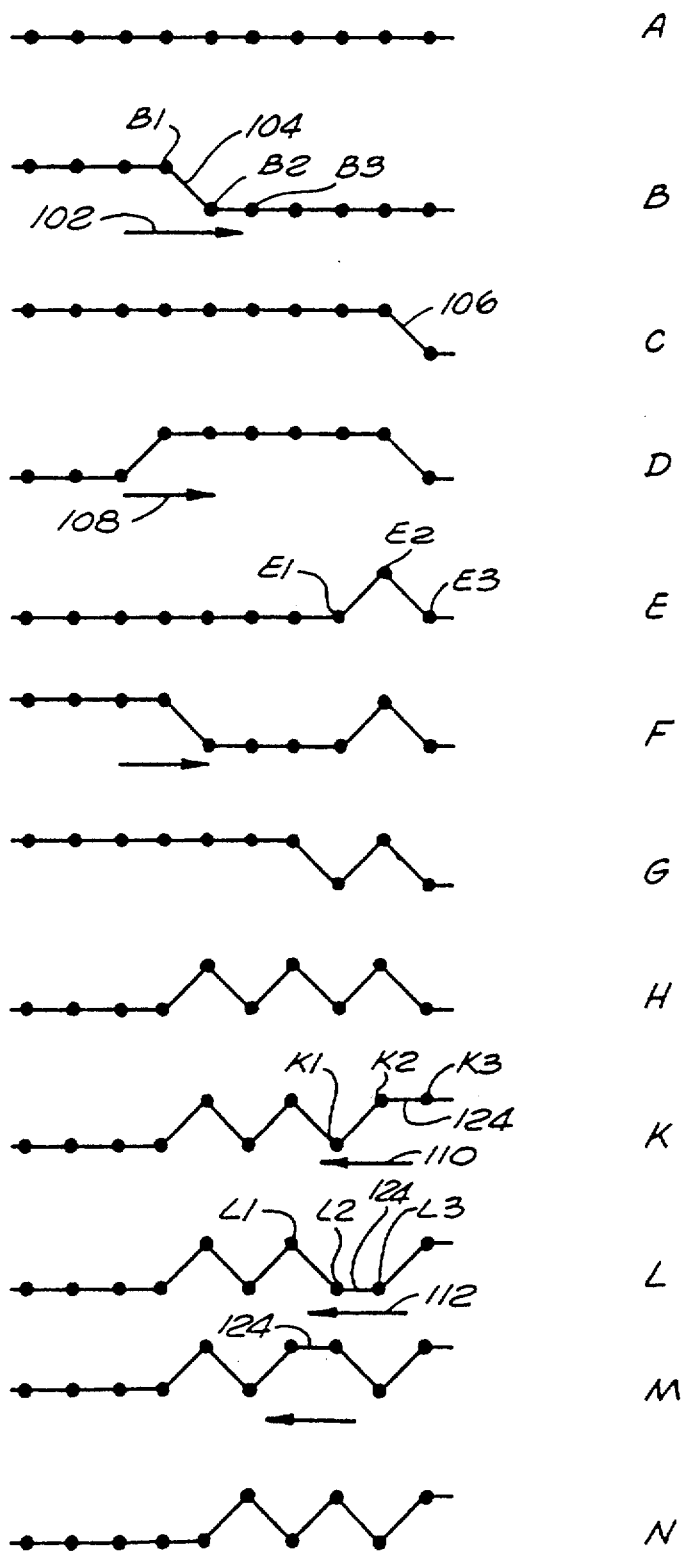
FIGS. 3A, 3B, 3C, 3D, 3E, 3F, 3G, 3H, 3I, 3J, 3K, 3L, 3M and 3N of state diagrams showing conditions of a control component similar to that of FIG. 1 at various stages of operation.

Implementing the stated rule of operation, consider now an assumed practical sequence of operation as illustrated in FIG. 3. The drawing shows a series of state diagrams which illustrate the activity of the control system C. However the illustrated system contains ten control elements CE (rather than four as shown in FIG. 2). The lines in the FIG. 3 state diagrams are labelled FIG. 3A through FIG. 3N and depict the states of a series of control elements in a control unit C. The dots on each line in FIG. 3 represent in sequence the current states of ten supposed control elements CE in a row. Thus, each line with high or low dots manifests all states in the control unit C (binary) at a particular instant of time. The data unit D is controlled accordingly.

The extreme left dot on each line in FIG. 3 indicates the state of the first control element by being either raised or lowered The extreme right dot on each line indicates the state of the last control element. The vertical position of dots along the lines represent the binary state of the corresponding control elements in the sequence of their arrangement in the represented control unit. To depict a control element in a high state, the dots and lines in FIG. 3 are elevated. If a control element is in a low state, the correspondingly positioned dot in the sequence is depressed. Thus diagonal segments of the line in FIG. 3 (see FIG. 3B) represent situations where the states of two adjacent control elements differ. Finally with regard to the representation format, arrows, as shown under the lines in FIGS. 3B, 3D and 3F indicate unstable or transitory conditions.

In FIG. 3A, the state of the control unit is depicted for an empty pipeline processor. With the system empty (no registered digits), a binary bit received by the processing unit P would be processed stage-by-stage moving without any imposed delay through to the last processing cell PS in the unit.

FIG. 3B shows a dynamic condition in the control unit indicating that a data element has been received and is being advanced through the processing unit P. Accordingly, an edge 104 (state difference) as illustrated above an arrow 102 depicts a dynamic condition in which the state difference is moving through the control unit C indicating a similar movement of a data bit through the processing unit P.

To the extent that data or bits are accumulated in a processing unit because the output apparatus is not ready, bits will collect in the final cells of the processing unit somewhat in the form of a lineup or a queue of people. To explain the manner in which the states of a control unit develop to accord such a situation, consider the three control elements represented by dots B1, B2, and B3 in FIG. 3B.

At the instant depicted, the control element B2 will soon change to the elevated state, because the state of its predecessor element B1 and that of its successor element B3 differ. On the other hand, element B1 is stable, because although its predecessor (not labelled) and its successor B2 differ in state, element B1 has already reached the same state as its predecessor as indicated by the horizontally extending line to its left. Thus, the diagonal edge 104 (FIG. 3B) will step and continue stepping to the right, in the direction in which information is to be passed through the processing unit P. As a general rule, any isolated diagonal edge in the representations of FIG. 3 will move to the right in an action analogous to people closing up a line. On the other hand, sections of horizontal lines in FIG. 3 indicate clear stable conditions.

As indicated above, the final control element CE in a control unit (right end of lines in FIG. 3) is held, that is it is not permitted to change state until the receiving apparatus coupled to the processor indicates it is ready. Consequently, when the diagnal edge 104, FIG. 3B reaches the output end (right) of the control unit, it will remain there as the edge 106 illustrated in FIG. 3C, awaiting the time when the output from the processing unit can be accepted. In that regard, assume a situation in which a number of data bits are received before output can be accepted. That occurrence is treated below with continuing reference to the drawings of FIG. 3.

A second wave of control activity, which accompanies the second datum, is indicated at the input end of the control unit as illustrated in FIG. 3D. As fast as the circuits of the system can operate, the wave will come to rest against the first wave as illustrated in FIG. 3E. Consequently, the states of the final control elements represented by dots E1, E2 and E3 are as shown in FIG. 3E. The element of dot E1 is stable because although its predecessor (not labeled) and its successor (element E2) differ in state, the element E1 already has taken the same state as its predecessor. The element E2 is stable because its predecessor element E1 and its successor, element E3 have the same state (opposed to that of element E2). The element E3 is stable because it is prevented from changing by an imposed condition for the final stage of the control unit C (hold data).

As additional waves of control activity (accompanying additonal input) arrive at the input of the control unit, they will initiate activity to close or stack up in a line at the output end of the unit as illustrated by FIGS. 3G and 3H. Again, it is important to appreciate that these operations are not clocked, rather their activity is synchronous. Also, control element states as manifest by the edges indicate existing data preparatory to departing the processing unit P (FIG. 1) as it may be accepted from the output.

Recapitulating to some extent, controlled by the control unit, the movement of datum in the processing unit D is somewhat analogous to the movement of people in an orderly line. The first arrival immediately moves through the processing cells PS to the head of the line as the sequence of process operations is performed. Each subsequent arrival similarly moves through the processing steps and takes a place, being stored at the end of the line. Additional aspects of the line analogy are also important. Specifically, as each opening occurs at the head of the line (output) the line immediately closes. Also, new arrivals immediately move to occupy the last position in the closed line. The analogy is deemed helpful in appreciating the asynchronous operation of the system, independent of timing constraints. As in a line of people, data immediately moves to close up at the front of the line to subsequently exit on call, in order regardless of the space behind them.

The operations attendant the departure of data from the system are depicted in FIGS. 3H through 3N. In FIG. 3H, there are three humps, each including two edges interconnecting dots representative of control elements. The edges of these humps indicate that the last seven control elements (dots) in the control unit are in states that differ alternately. Note that this is a stable condition because each control element is either in the same state as its predecessor or is preceded and followed by control elements that are in the same state.

If the last control element is permitted to change state, as it would when a data bit is accepted from the processing unit P, the states shown in FIG. 3K will occur. However, that state is not stable as is indicated by the arrow 110. Consequently, further change promptly follows.

Consider the three control elements as represented by the dots labeled K1, K2, and K3 in FIG. 3K in view of the stated operating rule. The control element K1 is stable because its predecessor (not labeled) and successor element K2 are in the same state. The control element K3 is stable because it is in the same state as element K2. The control element K2, however, is not stable because its predecessor element K1 and successor element K3 are in different states. Consequently, the control element K2 changes state to create the situation illustrated in FIG. 3L. That state also is unstable, as indicated by the arrow 112, and will rapidly change to the state illustrated in FIG. 3M.

Note that the short flat section of the line 124 (right of FIG. 3K) moved to the left in FIG. 4L and further to the left in FIG. 3M. The line 124 continues to move to the left until the stable condition shown in FIG. 3N is attained. The short flat line 124 represents a pair of ajacent control elements that are in the same state. As the adjacent common state pair of control elements (represented by the line 124) propagates to the left, it permits data stored in the processing unit to move forward (right) by one cell.

Consider now the manner in which control elements CE (FIG. 1), with the various states represented in FIG. 3, function in relation to the processing cells PS. As indicated above, the processing cells PS each include amplifier structures, a processing apparatus and switching apparatus. The individual cells are similar except for the processing apparatus which may take a wide variety of different forms.

Figure 4:
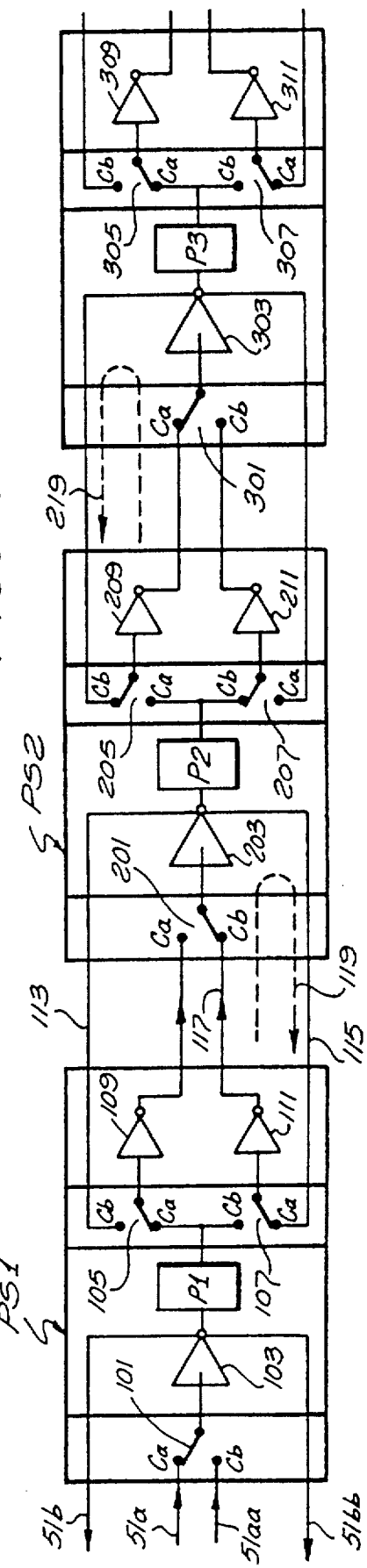
FIG. 4 is a symbolic block diagram of a portion of the system of FIG. 1.

Referring to FIG. 4, three processing cells PS1, PS2 and PS3 are represented. As depicted the cells are structurally similar, consequently the description of cell PS1 in detail also applies to the cells PS2 and PS3. The line pair enters the cell PS1 as a pair of separate conductors 51a and 51aa terminating at the stationary contacts of a double-throw, single-pole switch 101. For purposes of illustration a mechanical representation is illustrated; however, it is to be understood that the electronic format of such structure will normally be used in commercial systems.

The switch 101 is controlled by the associated control element CE, i.e. by the signal Ca, see FIG. 2. Depending on the state of the associated control elements CE, the switch 101 is either commanded by a signal Ca to be in the raised position or by a signal Cb to be in the lowered position.

The movable contact of the switch 101 is connected to an inverting amplifier 103 which is in turn connected to a processor P1. As indicated above, the processor P1 may take a wide variety of different forms, and in a related manner the amplifier 103 may also vary, for example, taking a non-inverting form.

The processor P1 provides an output to the stationary contacts of a pair of switches 105 and 107, both being of a double-throw single-pole form and controlled oppositely to the switch 101 by the associated control element CE providing signals Ca and Cb. Again, for simplicity the electromechanical representation is used.

The movable contacts of the switches 105 and 107 are connected respectively to inverting amplifiers 109 and 111. The output from the amplifiers 109 and 111 provide signals to the successor cell PS2. Retrograde data paths 113 and 115 from the cell PS2 are provided returning to the external stationary contacts of the switches 105 and 107. Note that these signals are provided from the inverting amplifier 203 in the cell PS2.

Figure 5:
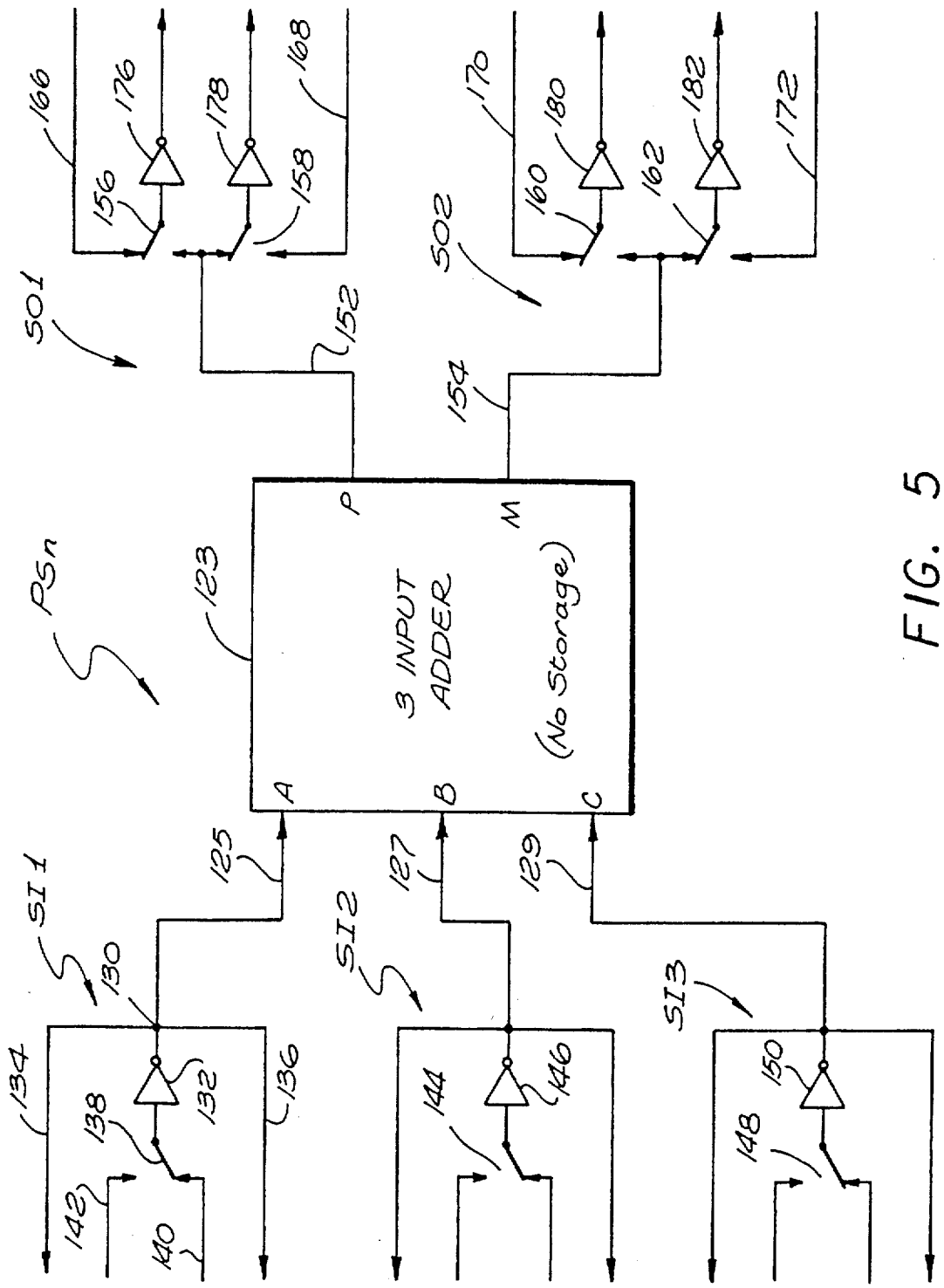
FIG. 5 is a block and circuit diagram of an alternative form of a component of the system of FIG. 1.

In the configuration as represented in FIG. 5, the pairs of amplifiers, e.g., amplifiers 109 and 111 are arranged with a pair of switches, e.g. 105 and 107. The amplifier 109 takes as input either the output of the processor P1 as illustrated, or the retrograde signal from the amplifier 203. Of course, selection depends upon the state of the control signals Ca and Cb from the associated control element. Somewhat similarly, the amplifier 111 receives either the retrograde signal from the amplifier 203 or the output of the processor P1, again depending upon the state of the control signal.

The states of the processing cells PS1, PS2 and PS3 are shown as they would exist under control of the control unit C in a state as depicted in FIG. 3E. Essentially, the processing cells PS1 and PS3 are in the state of the signal Ca being high, while the processing cell PS2 is in the state associated with the control signal Cb being high.

Initially, assume a situation in which all of the cells PS1, PS2 and PS3 are in the same configuration. Specifically, assume the switches of the cells PS1 and PS3 to be as depicted and the switches of cell PS2 to be opposite to the illustrated positions. Such a configuaration is commanded if all of the control signals are identical, for example, in the state represented in FIG. 3A.

In the assumed state, signals entering the cell PS1 on conductor 51a pass through the switch 101 then through the amplifier 103 for processing by the processing unit P1. The output signals from the processing unit P1 pass through the switch 105, the amplifier 109 and the switch 201 (assumed in a position different than illustrated) then through the amplifier 203 to the processor P2. The output from the processor P2 is supplied through the switch 205 (positioned differently than illustrated) through amplifier 209, then through the switch 301, and the amplifier 303 to the processing unit P3. From the processing unit P3, the output is passed through the switch 305 and the amplifier 309 to continue in the pipeline. Accordingly, a wave of activity moves through the entire system. It is noteworthy that when the system is in this state, there are no existing active storage elements. In that state, the asynchronous pipeline processor is empty and it behaves like a conventional combinatorial circuit without storage. A multiplier built in this way can function as a simple array multiplier when it is empty. Of course, the analogy would apply for any of a wide variety of other processing systems.

Continuing now to refer to FIG. 4, note that whenever signals are presented to a processing unit, e.g., processor P2, such signals are also presented to the predecessor cell along retrograde data paths. Specifically, note that the signals presented to the processor P2 (processor cell PS2) also are presented back to the processor cell PS1 through retrograde data paths 113 and 115. Alternatively, one of the switches 105 or 107 will connect one of the paths 113 or 115 to one of the amplifiers 109 or 111.

In the configuration as illustrated in FIG. 4, the signal applied to the processing unit P2 is also supplied through the retrograde data path 115 and the switch 107 for application to the amplifier 111. Accordingly, the signal on the conductor 117 will be an inverted copy of the signal in the data path 115. Accordingly, if two adjacent processing cells, e.g., cells PS1 and PS2 are set in opposed states by their received control signals, a storage capacity is established between the two cells. Specifically, such a storage capacity or flip-flop 119 is illustrated in FIG. 4 by a dashed loop line. Thus, when the two diagonal lines are represented as in FIG. 3E flip-flop storage is provided. See flip-flops 119 and 219.

When the asynchronous pipeline processor is filled with data, the states of the control elements will alternate and there will be as many elements of data stored in the asynchronous pipeline processor as there are stages in the processor.

As indicated above, the individual processing units P1, P2, P3 and so on, may take a wide variety of different forms. Essentially, the processing unit P, might provide substantially any combinatorial logic function that is free of storage. The very simplest function would perform, performs no logical operations simply passing input along to output. As another alternative, the processing unit P might perform an addition or a subtraction or perform a table look up function. A processing unit that performs such a function is merely one stage in a first-in-first-out register set as described in the parent case hereto. Such processing cells are nevertheless useful in asynchronous pipeline processors for transporting some section of input information forward towards the output unchanged while other sections of the information are being processed. Such units also are useful for buffering information at the input and output of an asynchronous pipeline processor so as to obtain higher power levels for driving physically larger circuits or higher burst data rates as may be required.

Further consideration with regard to FIG. 4 involves the couplings and switch capacities of the processing cells PS. Each of the processing cells PS is connected to another processing cell PS by four wires or data paths. Alternatively, depending on the amount of data that is being delivered to another neighboring cell, a plurality of wires for data paths might be employed. For example, a processing unit P dealing with eight-bit words would utilize a line 51a, for example, incorporating eight individual wires. Thus, particular designs of specific asynchronous pipeline processors will have different numbers of data bits being processed and will, accordingly, involve different numbers of wires employed between and in association with different processing cells PS.

Different processing cells in an asynchronous pipeline processor may also differ in the amount of data received from adjacent or neighboring cells. For example, if the processing cell 16 (FIG. 1) were intended to perform the addition of two-eight bit numbers to produce a nine-bit sum, the input signalling apparatus, e.g. line 22a, would provide wires for sixteen bits of data. The output capability of the cell 16, i.e. line 24, would possess the capacity of signaling a single nine-bit number, e.g. carry nine individual wires.

Just as the number of bits in the inter-connection signaling apparatus may be different in different parts of a single processor or in different processors, so the input or output switches in different data cells may control different numbers of bits. In general, the number of bits in each of the four inter-cell data paths as path 113 (FIG. 4) involve the same number of bits. The same number of bits would be delivered to the processing logic P2 inside the processing cell PS2. The processing cell PS2 may deliver a different number of bits to the output amplifiers 205 and 207. Accordingly, the output amplifiers 205 and 207 must accommodate an appropriate number of bits in all four of the represented signaling means at the output side of the cell PS2 to accommodate the same number of bits. Thus, any processing cell PS might be constructed to change the number of bits being passed down the asynchronous pipeline processor.

Exemplary of the multiple input and multiple output data paths as discussed above, FIG. 5 illustrates the input and output to an adder. Specifically, an adder 123 additively combines three binary bits of data to produce two binary bits. The three-input adder 123 receives inputs on three wires 125, 127 and 129 each of which is analogous to a single amplifier input to the processing units P in the processing cells of FIG. 1.

The wire 125 (FIG. 5) is connected to a junction point 130 which is at the output of an inverting amplifier 132 that is part of a switching structure SI1. The lines 134 and 136, connected from the junction point 130, constitute retrograde data paths. The input to the amplifier 132 is from the movable contact of a switch 138. The stationary contacts of the switch (single-pole double-throw) constitute the forward data paths to the processing cell as represented.

The input switching structure SI2 and SI3 are similar to the above-described switching structure SI1. In that regard, the switching input SI2 includes a switch 144 and an inverting amplifier 146 while the switching structure SI3 includes a switch 148 and an inverting amplifier 150. Because there are three input bits, the three switching inputs SI1, SI2 and SI3, are provided to comprise: multiplicand, partial product, and carry.

The output switch structures SO1 and SO2 need accommodate only two bits. The outputs (from the adder 122 designated P and M) are connected by wires 152 and 154 to the stationary terminals of a pair of single-pole double-throw switches. Specifically, the conductor 152 is connected to a stationary contact of switches 156 and 158 while the conductor 154 is connected to the stationary contact of switches 160 and 162. The alternate stationary contacts of each of the switches 156, 158, 160 and 162 are connected to retrograde data lines or wires 166, 168, 170 and 172. The moveable contacts of the switches 156, 158, 160 and 162 are connected respectively to inverting amplifiers 176, 178, 180 and 182 which are in turn connected to the forward output data paths.

All of the switches as represented in FIG. 5 are controlled by the common control signals Ca and Cb for the stage as explained with respect to the control unit C (FIG. 1). Generally, the switches at the input, e.g. switch 138, are in an alternate configuration from the switches at the output e.g. switch 156. Specifically, the switch 138 is in a lower position when the switch 156 is in a raised position. Accordingly, the individual switches each function precisely as explained above with respect to the structure of FIG. 4.

The adder 123 may take various forms as well known in the prior art to generate parity (P) and majority (M) digits. Specifically, the adder may perform the logic operations:

| INPUT | OUTPUT |
|-------|--------|
| A B C | M   P  |
| 0 0 0 | 0   0  |
| 0 0 1 | 0   1  |
| 0 1 0 | 0   1  |
| 0 1 1 | 1   0  |
| 1 0 0 | 0   1  |
| 1 0 1 | 1   0  |
| 1 1 0 | 1   0  |

| -continued | |
|------------|--|
| INPUT | OUTPUT |
| 1 1 1 | 1   1  |

For example, a primitive logic implementation might simply involve gates or executing the logic:

$$(A \cdot B' \cdot C) + (A' \cdot B \cdot C) + (A' \cdot B' \cdot C) + (A \cdot B \cdot C) = P$$

$$(A \cdot B \cdot C') + (A \cdot B' \cdot C) + (A' \cdot B \cdot C) + (A \cdot B \cdot C) = M$$

Figure 6:
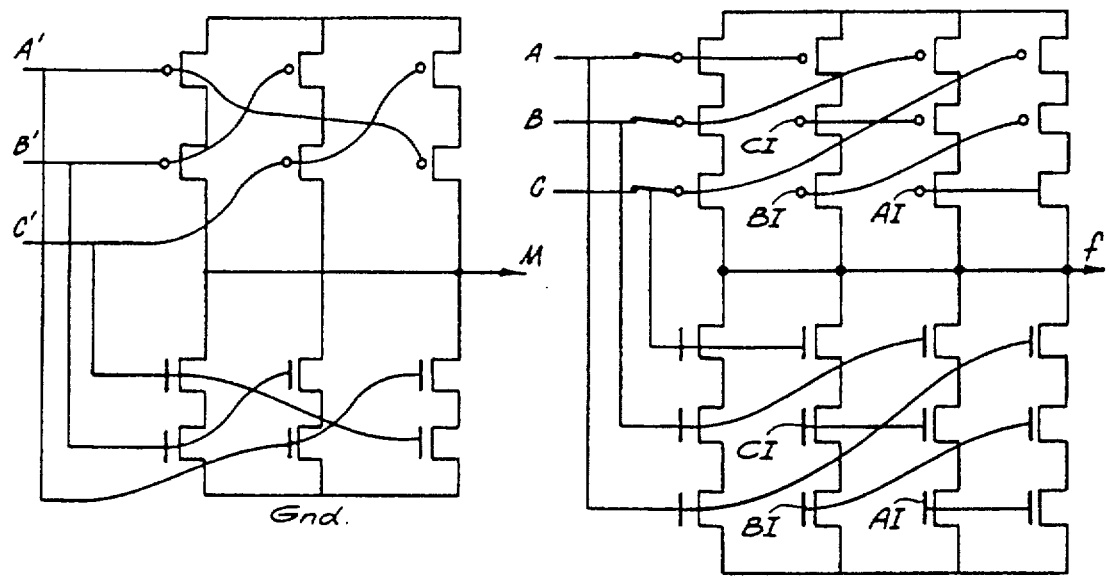
FIG. 6 is a CMOS logic diagram of the implementation for an adder as may be embodied in the system of FIG. 5.

In one structural form, the adder 123 may be implemented as a CMOS circuit as illustrated in FIG. 6. The CMOS circuit is presented in a logic format which will render the operation apparent to one skilled in the art. It operates because the parity and majority function of three variables are symmetric. That is, if an odd number of input signals, e.g. A B and C are in a high state, an even number will be low. Similarly, if a majority of the three input signals A, B and C are high, the minority will be low.

Figure 8:
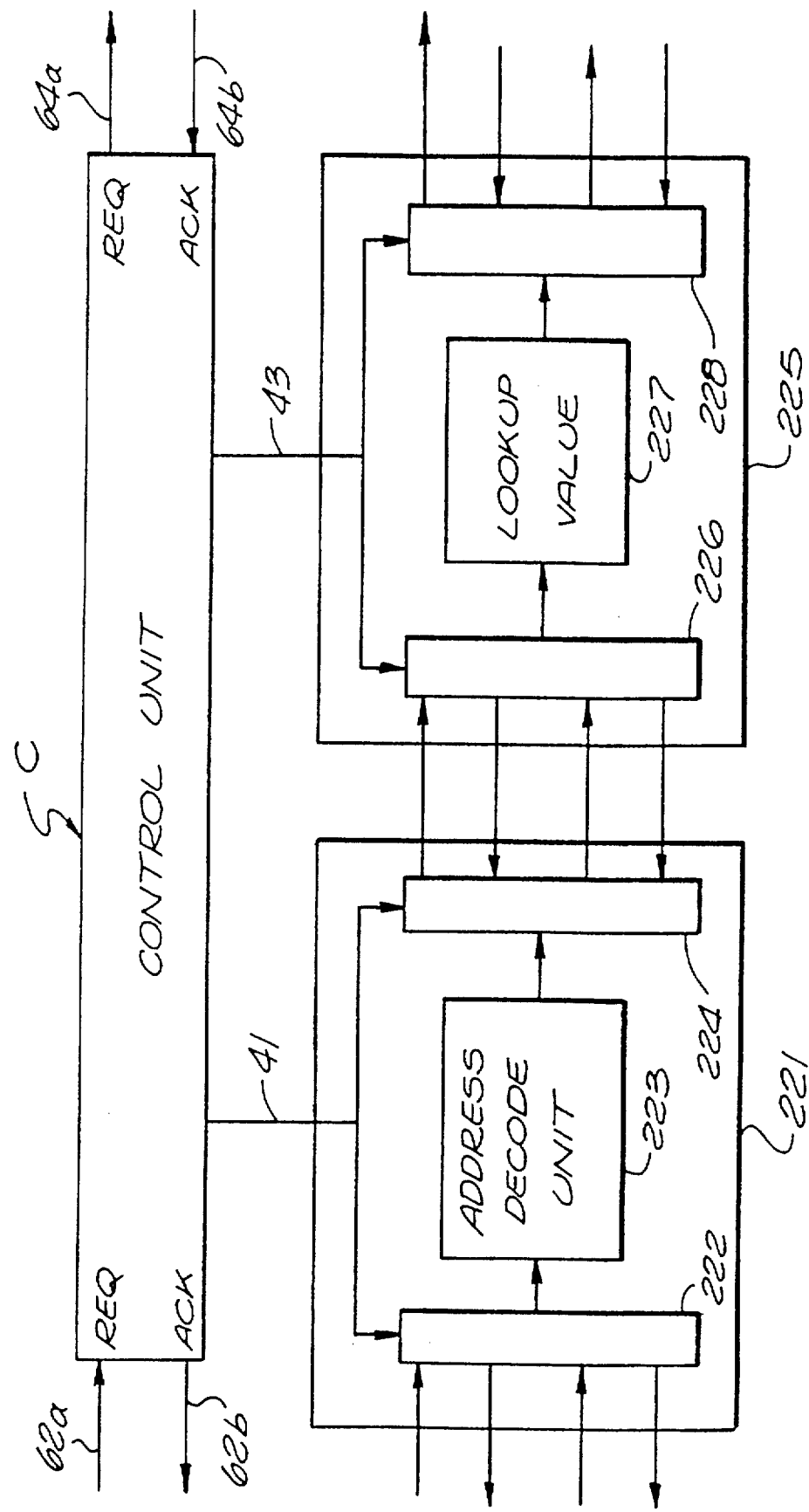
FIG. 8 is a block and circuit diagram of still another alternative form of the system of FIG. 1.

As indicated, the processor of the present invention may take many different forms. Considering another implementation of the asynchronous pipeline processor, FIG. 8 shows a processor implemented to function as a read-only memory. The two-stage system is controlled by the control unit C as previously described with respect to FIG. 1 utilizing request and acknowledgment signals applied at conductors 62a, 62b, 64c and 64d. In the embodiment of FIG. 8, a line 41 controls a processing unit 221 while a line 43 controls a processing unit 225. The two units cooperate to process data.

Input data, say eight bits, is received from the left and applied through the switching and amplifier structure 222 to the code unit 223. Essentially, the unit 223 decodes the eight bit binary code into a numeral, one of a two hundred fifty-six bit code, as required for looking up its value in the next unit. Thus, the input structure 222 constitutes eight bits in width but the output switch structure 224 is two hundred fifty-six bits wide.

The second processing cell 225 is responsible for looking up a value, as for example to provide an answer of fourteen bits length. Thus, the input structure 226 will be two hundred fifty-six bits wide while the output structure 228 will simply be fourteen bits wide.

If the read-only memory pipeline of FIG. 8 is empty, new addresses presented to the input structure 222 will produce output values delivered at the output switch 228. However, the control unit C may be activated by a change in the state of the input request line 62A so as to trap a partly processed data value in the pipeline. If this occurs, the control states passing on the lines 41 and 43 will differ and changes in the output data to the structure 222 will pass through the address decode stage processor 223 only and will not pass through the output structure 224 to the second processing cell 225.

The data cell 225 will receive input data from the previously processed data trapped between the cells 221 and 225. The device that accepts the output data from the structure 228 also can force that data to remain in place for as long as desired by retaining a signal on the input acknowledge control wire 64b.

When the output device is ready for a new output value, it will change the state of the output acknowledge wire 64b which will in turn cause the state of the control unit to change and thus change the state of the control line 43. When the control line 43 changes state to coincide with that on control line 41, the second processing cell 225 will process the output data of processing cell 221 rather than the older data that was trapped between the data cells. Thus, the new output value will become available after a delay established only by the properties of the processing cell 225 and independent of the properties of the cell 221, which previously had been able to complete the processing step.

Figure 7:
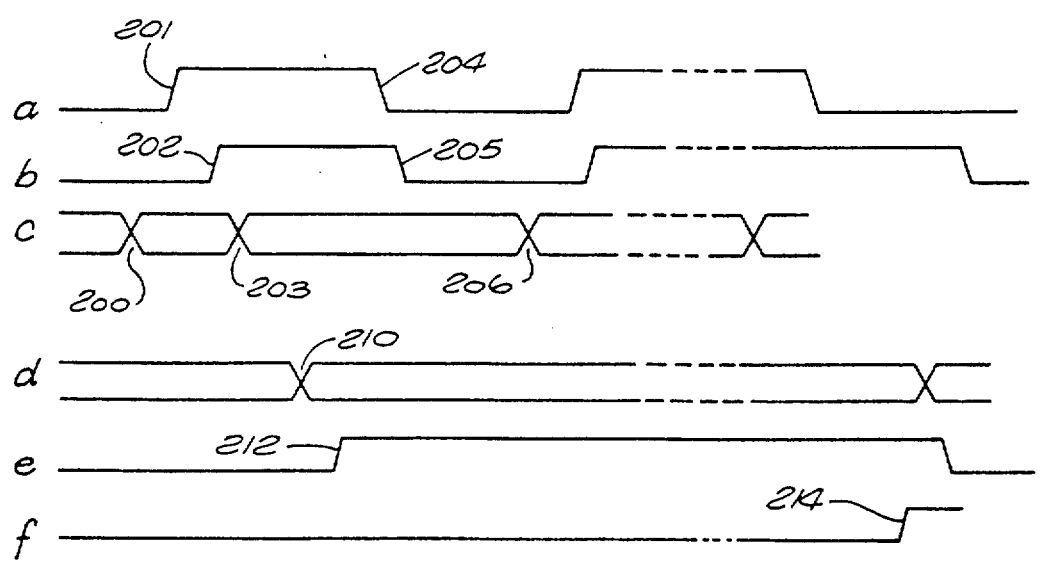
FIGS. 7a, 7b, 7c, 7d, 7e and 7f show a series of diagrams illustrating input and output operations.

The input and output protocol for the asynchronous pipeline as described herein is similar to protocols known in the prior art. FIG. 7 is a timing diagram that illustrates this protocol. Time is illustrated moving from left to right. The state of various control and data signals changing with time is illustrated by the various lines shown in the figure, each manifesting a binary signal.

The line representation of FIG. 7a depicts the state of the control input wire 62a in FIG. 2 showing edges 201 and 204. The line representation of FIG. 7b depicts the state of the control output wire 62b in FIG. 2 showing edges 202 and 205. The two line representations of FIG. 7c represent the state of the data input wires 51a in FIG. 1. The line representations of FIG. 7c are split to illustrate that the value of the data bits carried on wires 51a does not matter; what does matter is that the points in time at which that value can change either from "high" to "low" or from "low" to "high" in a binary format, as illustrated at cross-over locations 200, 203, and 206. FIGS. 7d, 7e, and 7f represent the actions at the three output wires 59a, 64a, and 64b, respectively. The protocol used at the input and output is accordingly evident.

From the above examples and explanations, it can been seen that embodiments of the system can be variously utilized to effectively process data. The system has several particularly advantageous applications, others will become apparent with acceptance. Accordingly, the scope hereof is submitted to be properly defined by the following claims.

What is claimed is:

1. A data processing apparatus comprising:
   a plurality of like cells connected in sequence, one cell being connected with similar predecessor and successor cells for asynchronous operation to process received data signals, said one cell including:
   a processor means in said one cell;
   amplifier means in said one cell, coupled to said processor means to provide a processor path in said one cell, said processor path for receiving input data signals and producing output data signals having a predetermined processed relationship to said input data signals;
   switch means in said one cell for coupling said processor path to a predecessor cell as one adjacent sequential pair of cells and to a successor cell as another adjacent sequential pair of cells, whereby said one cell is controlled to selectively supply said input data signals to said predecessor cell and to selectively supply said output data signals to said successor cell whereby, as the sole storage in said processing apparatus, said adjacent sequential pairs of said cells are switchable to establish a binary storage facility with representative states as a result of cooperative interaction therebetween; and
   said processing apparatus further comprising control means for said switch means in said one cell to set said switch means in accordance with received data signals and a predetermined propagation pattern for said cells in said plurality of like cells in sequence connection.

2. An apparatus according to claim 1 wherein said control means comprises a binary structure for said one cell and means for setting said binary structure in a predetermined propagation pattern with binary structures of said like cells, specifically to alter the state of said binary structure for said one cell in response to the state of the binary structure in a predecessor cell conditioned on the binary structure in said predecessor cell and the binary structure in a successor cell being in different states.

3. An apparatus according to claim 1 wherein said processor means comprises a binary adder.

4. An apparatus according to claim 1 wherein said processor means includes an input for at least one input binary bit and an output for at least one output binary bit and wherein said switch means includes at least a pair of input data paths coupled to said processor path for each of said binary bits for the input of said processor means and said switch means further includes at least a pair of output data paths coupled to said processor path for each of said binary bits for the output of said processor means.

5. An apparatus according to claim 4 wherein said amplifier means includes input amplifier means for each input of said processor means and output amplifier means for each output of said processor.

6. A system according to claim 5 wherein said processor means and said amplifier means operate asynchronously.

7. A system incorporating a plurality of data processing apparatus in accordance with claim 1 and wherein said control means includes a plurality of binary control elements each being associatively coupled with one of said like cells in sequence connection, said control elements being connected in sequence whereby to alter the registered state of the elements in response to the state of a predecessor element providing said predecessor and successor elements register different states.

8. A system according to claim 7 wherein said data processing apparatus and said plurality of control elements each operate asynchronously, each functioning independently of the other.

9. A pipeline data processing structure for receiving and processing applied data signals, comprising:
   a plurality of processing cells coupled in a predetermined sequence for asynchronous operation, each cell including, a combinatorial processor means having an input and an output for operating on data representations of said data signals, input amplifier means and output amplifier means coupled respectively to said input and said output of said processor means, input switching means for coupling said input amplifier means alternatively to provide data signals to said processor means in the processing cell or to a predecessor processing cell in said sequence, and output switching means for coupling said output amplifier means selectively to provide data signals to a successor processing cell in said sequence; and
   control means for actuating said switching means in accordance with said applied data signals to perform alternative control operations consisting of either moving data representations by data signals between said processor cells or establishing virtual flip-flops between said input and output amplifier means of adjacent cells in said sequence as the sole storage in the processing structure, said control means activating said switching means in accordance with a predetermined propagation pattern for said cells.

10. A pipeline data processing structure according to claim 9 wherein said control means comprises a plurality of binary elements interconnected in a sequence to control said plurality of processing cells by connection to said switching means.

11. A pipeline data processing structure according to claim 10 wherein said binary elements of said control means are interconnected for independent individual actuation in response to said applied data signals and whereby a binary element assumes the state of a predecessor element in said sequence providing that a predecessor element in said sequence and successor element in said sequence have different states.

12. A pipeline data processing structure according to claim 11 wherein said processing cells operate asynchronously.

13. A pipeline data processing structure according to claim 9 wherein said processing cells operate asynchronously.

14. A pipeline data processing structure according to claim 9 wherein said input amplifier means consists of an amplifier for each cell and said output amplifier means consists of two amplifiers for each cell.

15. A pipeline data processing structure according to claim 14 wherein said input switching means comprises first switching means to connect an input amplifier to receive signals from the output amplifiers of a predecessor cell and second switching means to connect output amplifiers to receive signals alternatively from the input amplifier of a successor cell or from the processor means of the same cell.

* * * * *